(12) United States Patent
Sakuma et al.

(10) Patent No.: US 7,994,642 B2
(45) Date of Patent: Aug. 9, 2011

(54) SEMICONDUCTOR DEVICE WHICH INCLUDES CONTACT PLUG AND EMBEDDED INTERCONNECTION CONNECTED TO CONTACT PLUG

(75) Inventors: Makoto Sakuma, Kanagawa-ken (JP); Yasushi Kumagai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/574,402

(22) Filed: Oct. 6, 2009

(65) Prior Publication Data

US 2010/0084770 A1 Apr. 8, 2010

(30) Foreign Application Priority Data

Oct. 6, 2008 (JP) ................................ P2008-259939

(51) Int. Cl.
*H01L 23/48* (2006.01)
*H01L 23/52* (2006.01)
*H01L 29/40* (2006.01)
*H01L 21/4763* (2006.01)

(52) U.S. Cl. ......... 257/774; 257/E21.585; 257/E23.141; 438/618

(58) Field of Classification Search .......... 257/744, 257/E23.141, E21.585; 438/618
See application file for complete search history.

(56) References Cited

U.S. PATENT DOCUMENTS

| | | | | |
|---|---|---|---|---|
| 5,656,543 A | * | 8/1997 | Chung | 438/625 |
| 5,834,369 A | * | 11/1998 | Murakami et al. | 438/625 |
| 6,143,647 A | * | 11/2000 | Pan et al. | 438/637 |
| 7,030,012 B2 | * | 4/2006 | Divakaruni et al. | 438/652 |
| 2002/0058408 A1 | * | 5/2002 | Maydan et al. | 438/637 |
| 2003/0214046 A1 | * | 11/2003 | Lee et al. | 257/767 |
| 2007/0155150 A1 | * | 7/2007 | Kim | 438/597 |
| 2008/0044999 A1 | * | 2/2008 | Dubin et al. | 438/619 |

FOREIGN PATENT DOCUMENTS

JP 2006-294979 10/2006

OTHER PUBLICATIONS

Integration Technology of 30 nm Generation Multi-Level NAND Flash for 64 Gb NAND Flash Memory, Kwak et al., 2007 Symp. on VLSI Technology Digest of Technical Papers pp. 12-13.

* cited by examiner

*Primary Examiner* — Kiesha R Bryant
*Assistant Examiner* — Igwe U Anya
(74) *Attorney, Agent, or Firm* — Oblon, Spivak, McClelland, Maier & Neustadt, L.L.P.

(57) ABSTRACT

A semiconductor memory device includes: a first dielectric formed on top of a semiconductor substrate; a contact plug embedded in the first dielectric; a second dielectric formed on top of the first interlayer dielectric; an interconnection layer embedded in a groove formed in the second dielectric on top of the contact plug; and an insulating film formed in the second dielectric adjacent to a side surface of the interconnection layer. The contact plug has a notch in a part of a top surface of the contact plug. The insulating film is formed to extend from a top surface of the second dielectric to the notch included in the contact plug.

21 Claims, 11 Drawing Sheets

SEMICONDUCTOR DEVICE WHICH INCLUDES CONTACT PLUG AND EMBEDDED INTERCONNECTION CONNECTED TO CONTACT PLUG

CROSS-REFERENCE TO RELATED APPLICATIONS

This application is based upon and claims the benefit of priority from the prior Japanese Patent Application No. 2008-259939, filed Oct. 6, 2008, the entire contents of which are incorporated herein by reference.

FIELD OF THE INVENTION

The present invention relates to a semiconductor device including a contact plug and an interconnection layer which is formed on the contact plug, and relates to, for example, a semiconductor device such as an NAND-type flash memory including a bit line contact and a bit line formed on the bit line contact.

DESCRIPTION OF THE BACKGROUND ART

Heretofore, interconnections formed by the damascene process (so called "damascene interconnections") have been widely used for bit lines and the like. The damascene interconnections are formed in grooves made in an insulating film, embedding an interconnection material in the grooves and then flattening the top of the insulating film by Chemical Mechanical Polishing (CMP).

In recent years, shrinking of semiconductor devices has decreased the distance between two neighboring bit lines (or between a bit line and its neighboring bit line contact). In addition, due to such shrinking, a bit line and its neighboring bit line contact are misaligned from each other in some cases. In these cases, a leakage current may flow between the two neighboring bit lines, or between the bit line and its neighboring bit line contact. The short-error occurrence rate will increase, because a breakdown voltage between the two neighboring bit lines, or between the bit line and its neighboring bit line contact, may be lowered.

Meanwhile, a stopper film for stopping a process in order to control the depth of each damascene interconnection is sometimes formed. In such cases, for instance, a silicon nitride film is used as the stopper film. For this reason, the silicon nitride film is present between each two neighboring bit lines, or between each bit line and its neighboring bit line contact.

The presence of the silicon nitride film between the two neighboring bit lines or between the bit line and its neighboring bit line contact increases a leakage current which flows via this silicon nitride film or via an interface between the silicon nitride film and the insulating film under the silicon nitride film. In addition, the presence of the silicon nitride film increases the short-error occurrence rate due to dielectric breakdown.

BRIEF SUMMARY OF THE INVENTION

A semiconductor memory device according to an exemplary aspect of the present invention includes: a first dielectric layer formed on top of a semiconductor substrate; a contact plug embedded in the first dielectric layer; a second dielectric layer formed on top of the first dielectric layer; an interconnection layer embedded in a groove formed in the second dielectric layer on top of the contact plug; and an insulating film formed in the second dielectric layer adjacent to a side surface of the interconnection layer, wherein a notch is located in a part of a top surface of the contact plug, and the insulating film is formed to extend from a top surface of the second dielectric layer into the notch included in the contact plug.

A method of manufacturing a semiconductor memory device according to an exemplary aspect of the present invention includes: forming a plurality of contact plugs in a first dielectric layer formed on a semiconductor substrate; forming a second dielectric layer on top of the first dielectric layer and the plurality of contact plugs; forming a plurality of grooves in the second dielectric layer; forming a plurality of interconnection layers by embedding conductor films in the plurality of first grooves, respectively; forming second grooves by etching part of the second dielectric layer, the first dielectric layer, and the plurality of contact plugs by using the plurality of interconnection layers as a mask; and embedding an insulating film in each of the second grooves.

Each of the first and second dielectric layers may be interlayer dielectric layers.

DETAILED DESCRIPTION OF THE PREFERRED EMBODIMENTS

Referring to the drawings, descriptions will be provided for embodiments of the present invention. For the descriptions, common component parts will be denoted with the same reference numerals throughout the drawings.

First Embodiment

The first embodiment is characterized by contact plugs and their respective interconnections formed on the contact plugs. For this reason, the rest of the structure of a semiconductor device according to the first embodiment will be omitted from the drawings.

Figure 1:
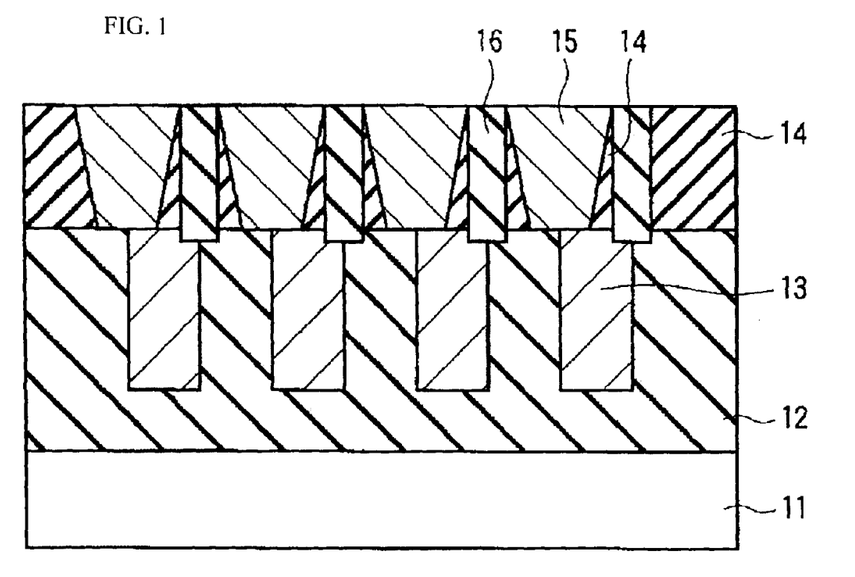
FIG. 1 is a cross-sectional view showing a structure of a semiconductor device according to a first embodiment of the present invention.

FIG. 1 is a cross-sectional view showing the structure of the semiconductor device according to the first embodiment. As shown in FIG. 1, a dielectric layer 12 is formed on a silicon semiconductor substrate 11. Contact holes are formed in a surface area of the dielectric layer 12. Contact plugs 13 each made of a conductor such as a metal, or polysilicon, are formed in the respective contact holes. Note that, although interconnections are respectively connected to the lower portions of the contact plugs 13, those interconnections are omitted from FIG. 1 for convenience.

Another dielectric layer 14 is formed on the dielectric layer 12. Interconnection layers 15 electrically connected to the contact plugs 13 are formed in the dielectric layer 14 on the contact plugs 13, respectively. Note that FIG. 1 shows the interconnection layers 15 and the respective contact plugs 13 which are misaligned from each other. In a case where the interconnection layers 15 and the respective contact plugs 13 are properly aligned to each other, all of the bottom surfaces of the interconnection layers 15 are in contact with the top surfaces of the contract plugs 13, respectively.

Also, a part of the bottom surface of each interconnection layer 15 is not in contact with the top surface of the corresponding contact plug 13, and vice versa. More specifically, a part of the bottom surface of each interconnection layer 15 is in contact with the dielectric layer 12, whereas a part of the top surface of each contact plug 13 is in contact with the dielectric layer 14. Note that the factor causing the state shown in FIG. 1 is not limited to the misalignment between the interconnection layers 15 and the contact plugs 13. The state in which the bottom surface of each interconnection layer 15 and the top surface of the corresponding contact plug 13 are not completely in contact with each other is also caused when the interconnection layers 15 are formed with a smaller width than a design value due to inconsistency in a lithographic process; and when the contact plugs 13 are formed with a larger width than a design value due to inconsistency in the lithographic process.

Each interconnection layer 15 has a damascene structure. The cross-section of each interconnection layer 15 is tapered downward with the angle of the taper being less than 90 degrees. In more detail, the cross-section of each interconnection layer 15 has a shape in which the width of the bottom surface is narrower than the width of the top surface. In addition, the dielectric layers 14 are formed on the side surfaces of each interconnection layer 15.

A groove is formed in the dielectric layer 14 between each two interconnection layers 15 by self-alignment by using the interconnection layers 15 as a mask. An insulating film 16 is formed in each groove. Here, the insulating film 16 is formed in such a way as to extend from the top surface of the dielectric layer 14 to the top surfaces respectively of the dielectric layer 12 and the corresponding contact plug 13, and further to extend into the dielectric layer 12 and the corresponding contact plug 13. In other words, a portion of the interlayer dielectric 12 and the corresponding contact plug 13 are removed, and a cavity is made in a part of the dielectric layer 12 and a part of the contact plug 13 between the corresponding two neighboring interconnection layers 15, and the insulating film 16 is formed in such a way as to enter the cavity. A notch is formed in contact plug 13. In addition, side surfaces of parts of an upper portion of each insulating film 16 are in contact with the neighboring interconnection layers 15, respectively; a side surface of part of a lower portion of the insulating film 16 is in contact with its corresponding contact plug 13; and side surfaces of the insulating film 16 between the upper and lower portions of it are in contact with the corresponding dielectric layer 14.

In the semiconductor device having this configuration: an insulating film 16 is formed between two neighboring interconnection layers 15; a contact plug 13 is neighboring to the interconnection layers 15; a corner portion is cut away from the neighboring contact plug 13 which is the closest to the interconnection layer 15; and an insulating film 16 is formed in the corner portion which is cut away. This can increase the direct distance between each two neighboring interconnection layers 15, the direct distance between any one interconnection layer 15 and its neighboring contact plug 13, as well as the distance of interfaces between the dielectric layer 12 and the dielectric layer 14, and the dielectric layer 12 and the insulating film 16. This accordingly can reduce a leakage current between any of interconnection layer 15, its neighboring interconnection layer 15 and a contact plug 13 neighboring to the interconnection layer 15, and can improve a breakdown voltage among any of interconnection layer 15 between its neighboring interconnection layer 15 and a contact plug 13 neighboring to the interconnection layer 15.

Dielectric layers 12 and 14 are preferably interlayer dielectric layers.

Next, descriptions will be provided for a method of manufacturing the semiconductor device according to the first embodiment.

FIGS. 2 to 8 are cross-sectional views of the respective steps which show the method of manufacturing the semiconductor device according to the first embodiment.

Figure 2:
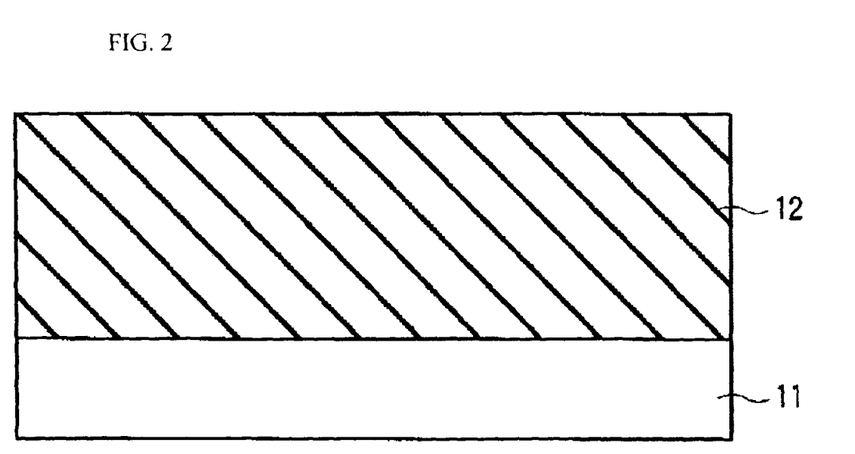
FIG. 2 is a cross-sectional view illustrating a step in a method of manufacturing the semiconductor device according to the first embodiment.
Figure 3:
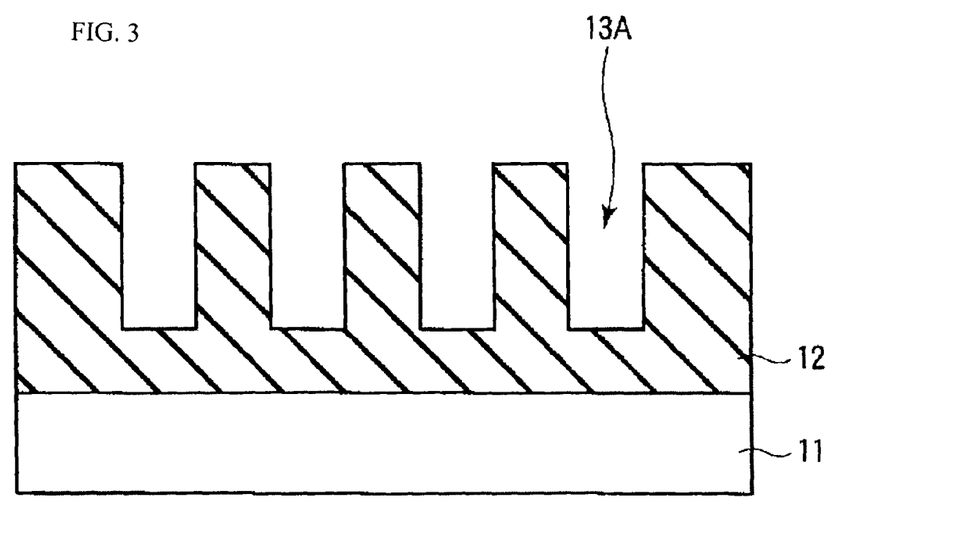
FIG. 3 is a cross-sectional view illustrating a subsequent step in the method of manufacturing the semiconductor device according to the first embodiment.
Figure 4:
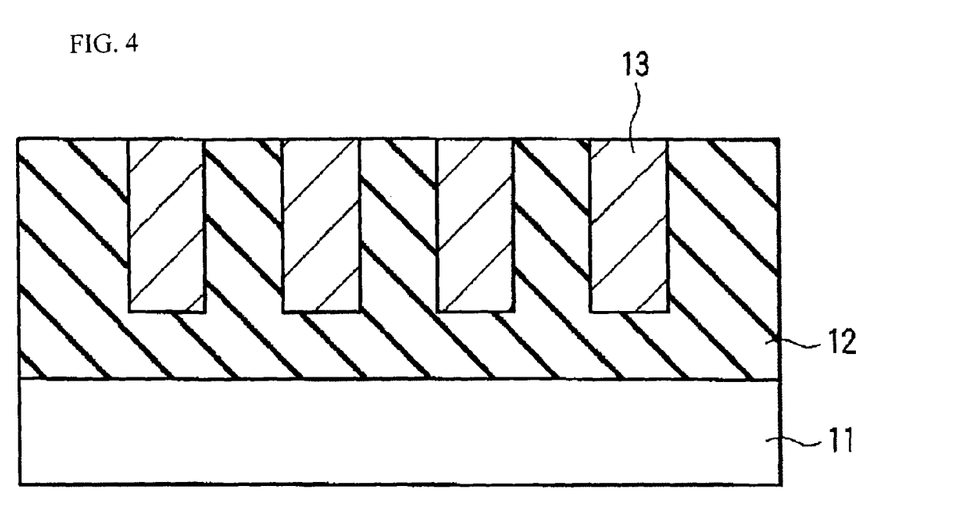
FIG. 4 is a cross-sectional view illustrating a subsequent step in the method of manufacturing the semiconductor device according to the first embodiment.

As shown in FIG. 2, a foundation structure on the semiconductor substrate 11 is embedded in the dielectric layer 12, for instance, a silicon oxide film. Subsequently, the top of the dielectric layer 12 is flattened by, for example, Chemical Mechanical Polishing (CMP). As shown in FIG. 3, the contact holes 13A are formed in the dielectric layer 12 by a lithographic method, and by an anisotropic etching method, for instance, Reactive Ion Etching (RIE). As shown in FIG. 4, the contact holes 13A are respectively embedded with films each made of a metal (for instance, tungsten (W)), a polysilicon or the like. Afterward, the top of the resultant dielectric layer 12 is flattened by CMP. Thereby, the contact plugs 13 are formed in the contact holes 13A in the dielectric layer 12, respectively.

Figure 5:
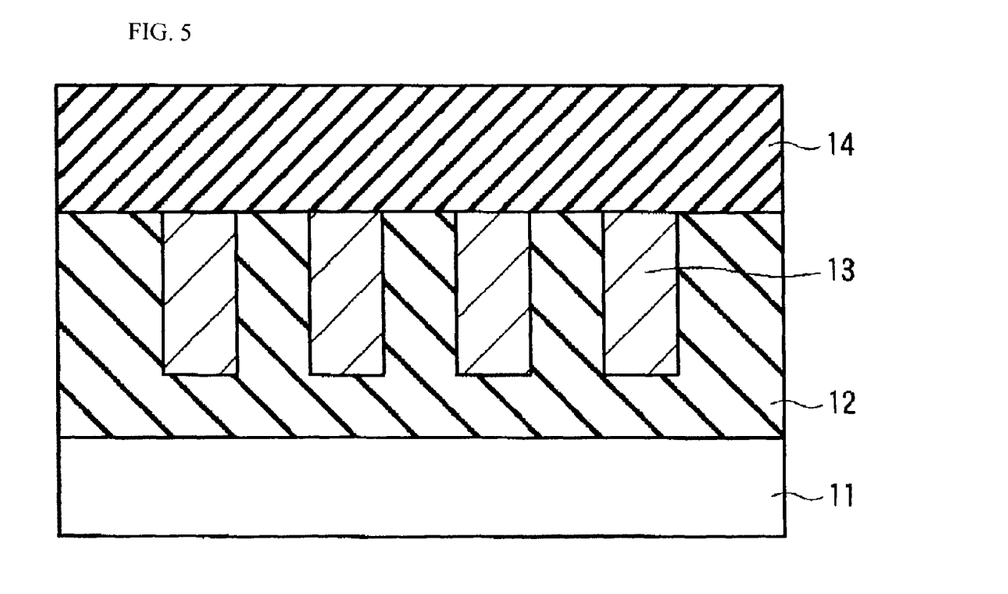
FIG. 5 is a cross-sectional view illustrating a subsequent step in the method of manufacturing the semiconductor device according to the first embodiment.
Figure 6:
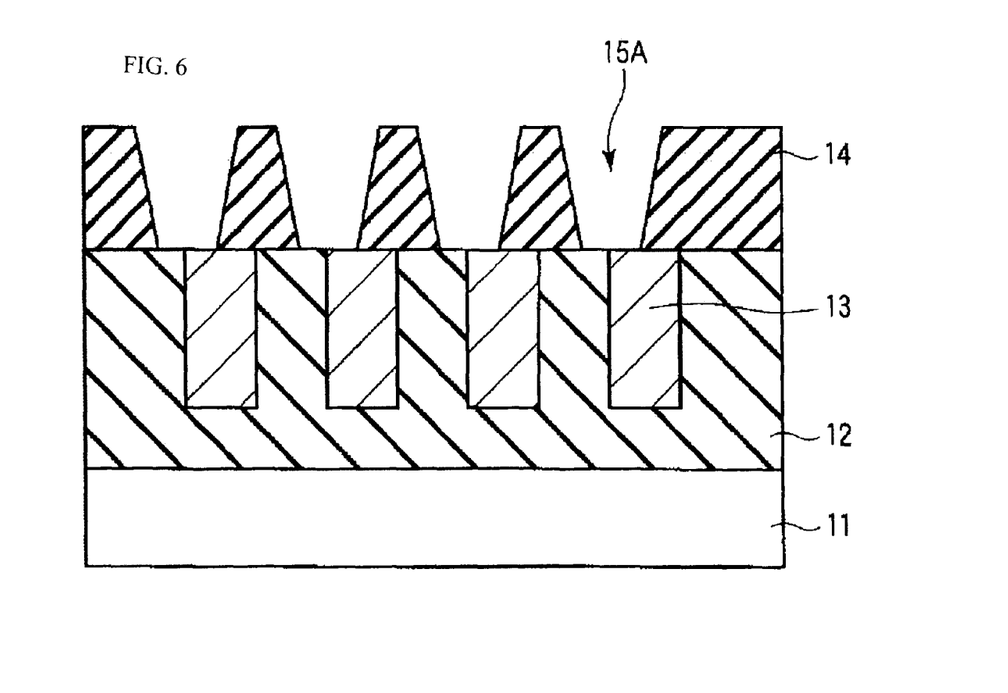
FIG. 6 is a cross-sectional view illustrating a subsequent step in the method of manufacturing the semiconductor device according to the first embodiment.
Figure 7:
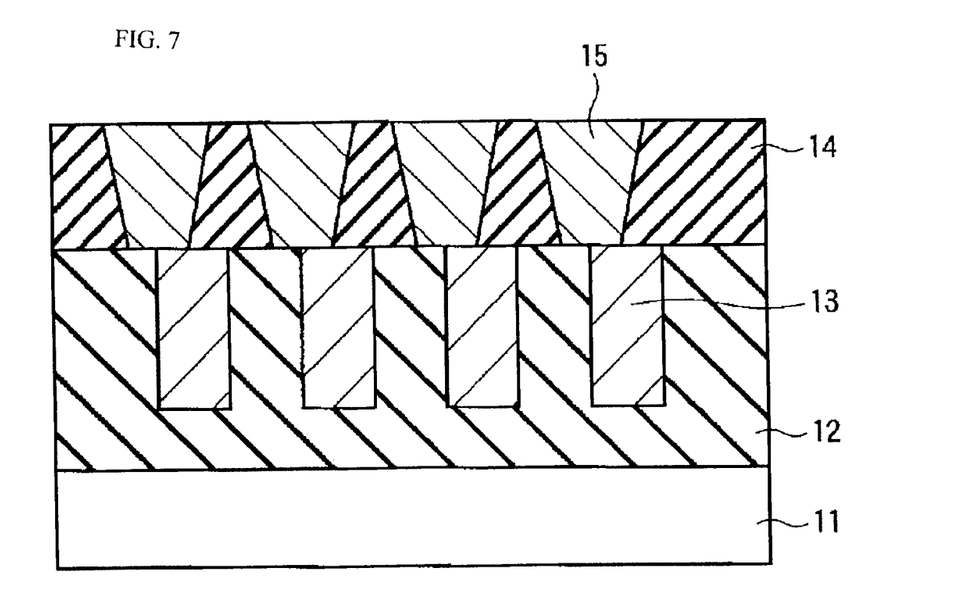
FIG. 7 is a cross-sectional view illustrating a subsequent step in the method of manufacturing the semiconductor device according to the first embodiment.

As shown in FIG. 5, the dielectric layer 14, for instance, a silicon oxide film is deposited on the dielectric layer 12 and the contact plugs 13 for forming damascene interconnections. As shown in FIG. 6, the interconnection grooves 15A are formed in the dielectric layer 14 by a lithographic method, and by etching using an anisotropic etching method (for instance, RIE). By this etching, the cross-section of each interconnection groove 15A is tapered downward with the angle of the taper being less than 90 degrees. In other words, the cross-section of each damascene interconnection is tapered downward. As shown in FIG. 7, conductor films each made of a conductor (for instance, copper (Cu), aluminum (Al), tungsten (W), titanium (Ti), titanium nitride (TiN), tantalum (Ta), tantalum nitride (TaN), ruthenium (Ru)) are embedded in the respective interconnection grooves 15A. Afterward, the top of the resultant dielectric layer 14 is flattened by CMP. Thereby, the interconnection layers (damascene interconnections) 15 each having the damascene structure are formed in the respective interconnection grooves 15A in the dielectric layer 14. In particular, interconnections each made of copper or the like which is incapable of being etched by subsequent anisotropic etching such as RIE of dielectric layer 14 can be formed by damascene process.

Figure 8:
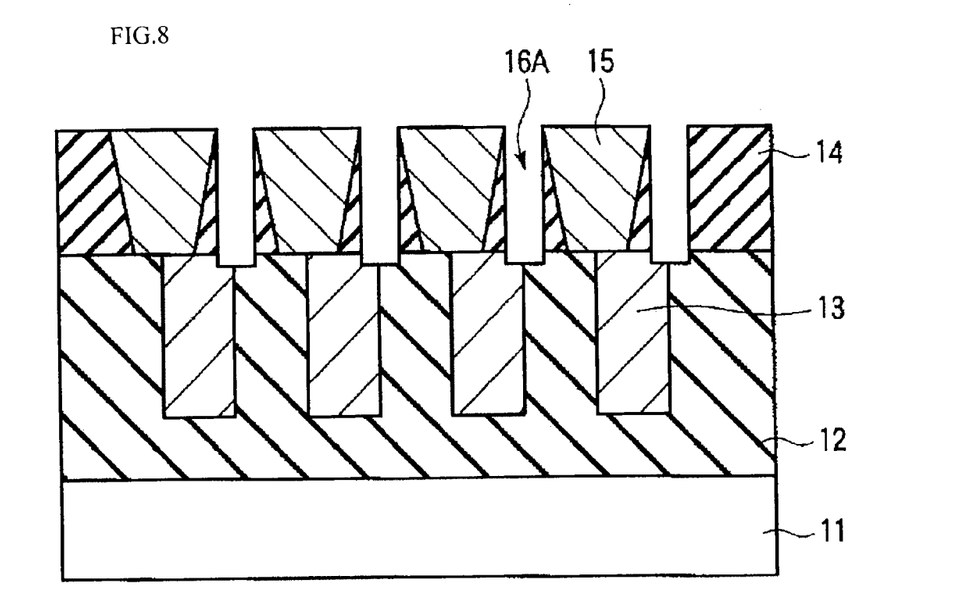
FIG. 8 is a cross-sectional view illustrating a subsequent step in the method of manufacturing the semiconductor device according to the first embodiment.

As shown in FIG. 8, by using the embedded interconnection layers 15 as a mask, the dielectric layer 14 between each two neighboring interconnection layers 15, parts of the dielectric layer 12 and parts of the contact plugs 13 are etched by RIE. Thereby, the grooves 16A are formed. For this etching process, first, the dielectric layer 14 is etched. Subsequently, the part of the dielectric layer 12 and the part of the contact plug 13 are etched to a predetermined depth from their respective surfaces. During this process, the grooves 16A are formed by self-alignment by using the interconnection layers 15 as a mask. For this reason, the grooves 16A are not misaligned with the interconnection layers 15.

As shown in FIG. 1, insulating films 16, for instance, silicon oxide films, are embedded in the respective grooves 16A, and the top of the resultant dielectric layer 14 is subsequently flattened. Thereby, the insulating films 16 are formed in the respective grooves 16A. Through the foregoing steps, the semiconductor device according to the first embodiment is manufactured.

Next, descriptions will be provided for a first modification of the first embodiment.

Figure 9:
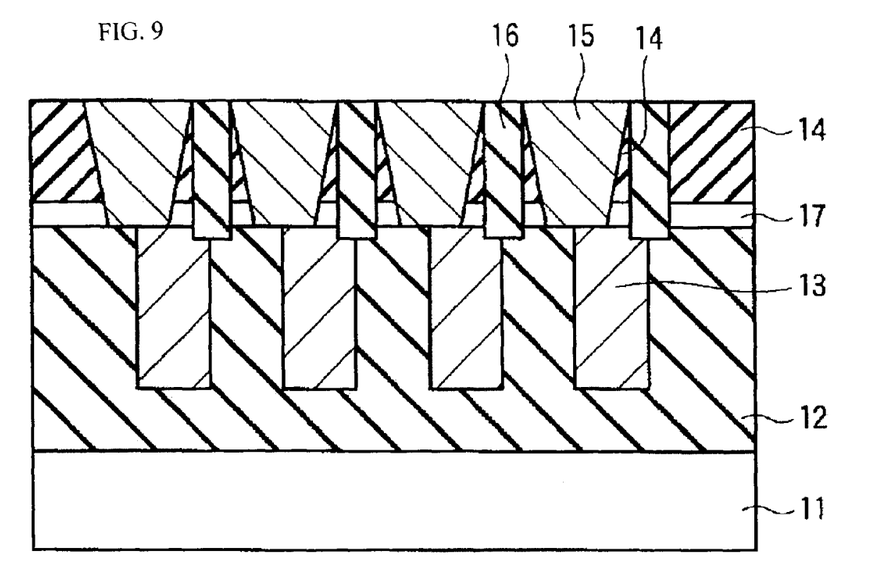
FIG. 9 is a cross-sectional view showing a structure of a semiconductor device according to a first modification of the first embodiment.

FIG. 9 is a cross-sectional view showing a structure of a semiconductor device according to a first modification of the first embodiment.

As shown in FIG. 9, a stopper film (bottom film) 17 is formed to be in contact with the side surfaces of each of the interconnection layers 15 which are formed on the contact plugs 13 and the dielectric layer 12. This stopper film is divided into sections between each two neighboring interconnection layers 15 by the insulating films 16. The stopper film 17 is in contact with sides of a lower portion of each interconnection layer 15 and sides of each insulating films 16. An undersurface of the stopper film is in contact with the contact plugs 13. A top surface of the stopper film is in contact with the dielectric layer 14. The stopper film 17 is, for instance, any one of: an insulating film such as a silicon nitride film; a polysilicon film; a conductor film made of a conductor such as tungsten (W), aluminum (Al), titanium (Ti), titanium nitride (TiN) and tantalum nitride (TaN). In other words, the stopper film 17 may be made of any material, as long as an etching rate of the stopper film 17 differs from that of the interconnection layers 15 and the dielectric layer 14. The rest of the configuration of the semiconductor device according to the first modification is the same as that in the first embodiment.

Next, descriptions will be provided for a method of manufacturing the semiconductor device according to the first modification of the present invention.

FIGS. 2 to 4 and FIGS. 10 to 15 are cross-sectional views of the respective steps which show the method of manufacturing the semiconductor device according to the first modification of the present invention.

Figure 10:
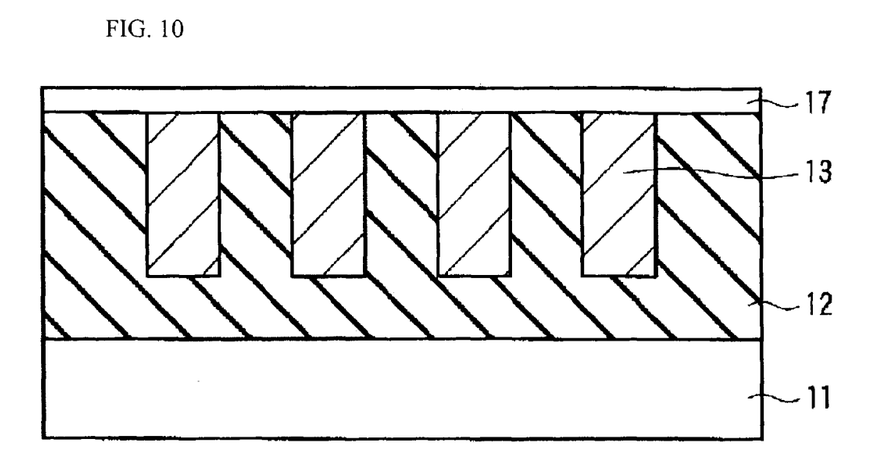
FIG. 10 is a cross-sectional view illustrating a step in a method of manufacturing the semiconductor device according to the first modification of the first embodiment.

The steps shown in FIGS. 2 to 4 are common between the first modification and the first embodiment. For this reason, the descriptions of the steps shown in FIGS. 2 to 4 are omitted. As shown in FIG. 10, a stopper film 17 is formed on the dielectric layer 12 and the contact plugs 13, which are shown in FIG. 4, by a chemical vapor deposition (CVD) method or a sputtering method. The stopper film 17 is a film having an etching rate different from that of the interconnection layers 15, such as copper. In addition, for the purpose of preventing the interconnection layers 15 from varying in height from one to another when the damascene interconnections are formed, it is desirable that the stopper film 17 should be a film having an etching rate different from that of dielectric layer 14.

Figure 11:
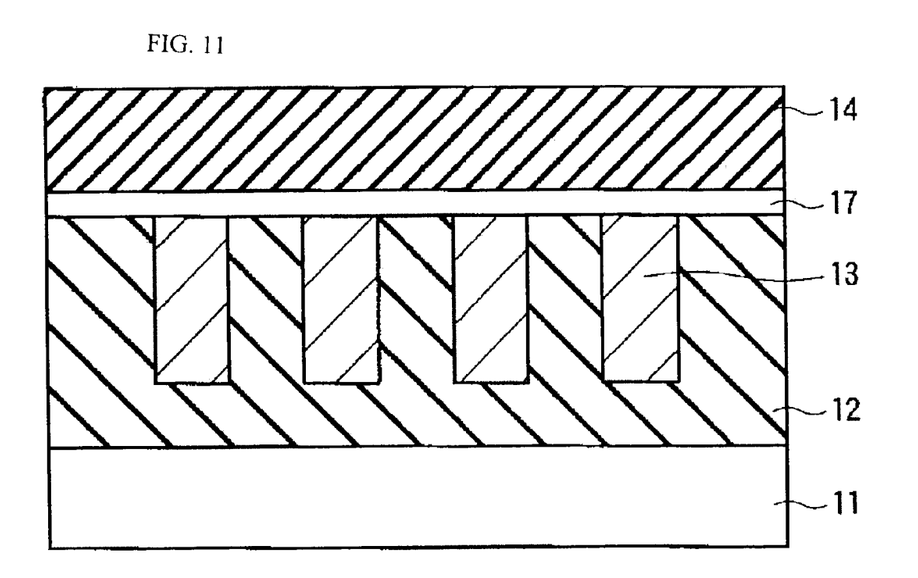
FIG. 11 is a cross-sectional view illustrating a subsequent step in the method of manufacturing the semiconductor device according to the first modification of the first embodiment.
Figure 12:
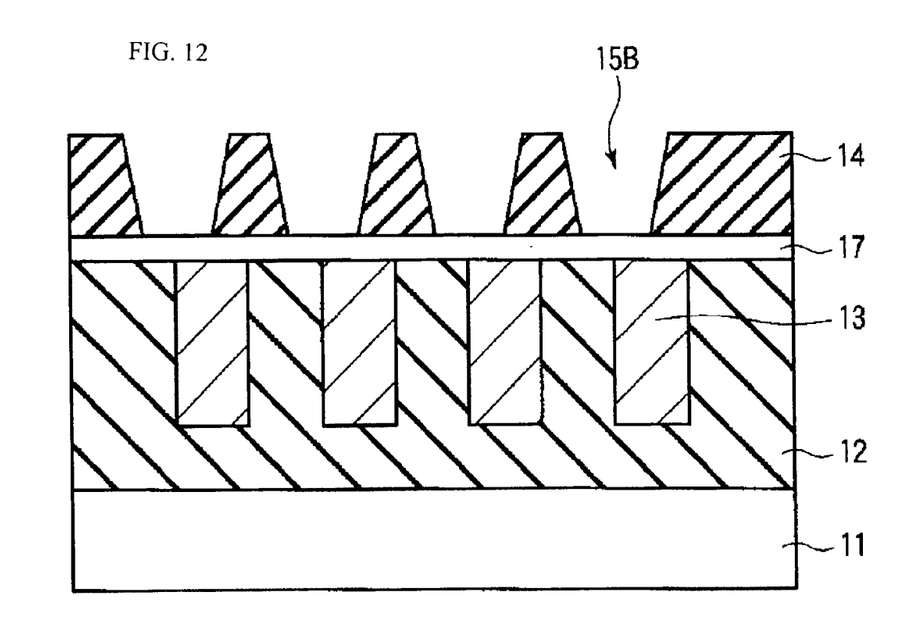
FIG. 12 is a cross-sectional view illustrating a subsequent step in the method of manufacturing the semiconductor device according to the first modification of the first embodiment.
Figure 13:
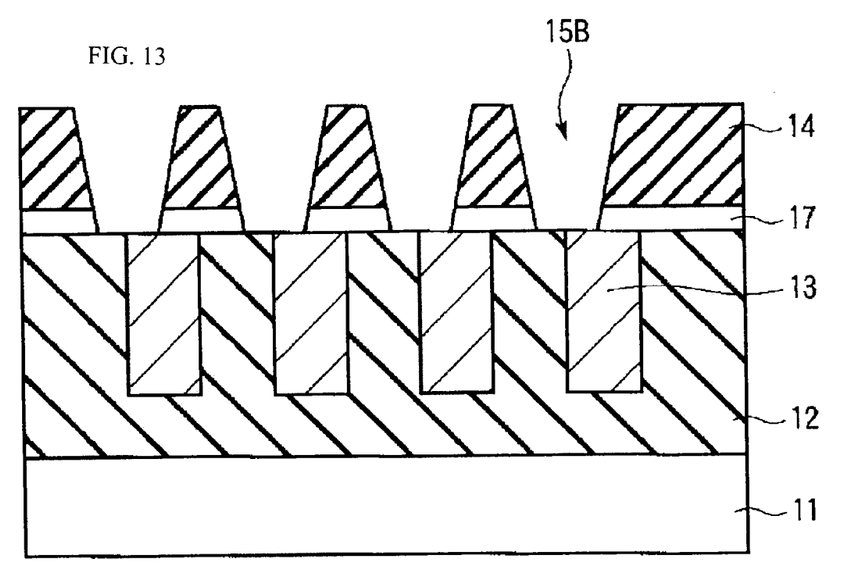
FIG. 13 is a cross-sectional view illustrating a subsequent step in the method of manufacturing the semiconductor device according to the first modification of the first embodiment.

As shown in FIG. 11, for the purpose of forming the damascene interconnections, the dielectric layer 14, for instance, a silicon oxide film is deposited on the stopper film 17. As shown in FIG. 12, interconnection grooves 15B are formed in the dielectric layer 14 by a lithographic method, and by etching using an anisotropic etching method (for instance, RIE). In this etching process, the depths of the respective interconnection grooves 15B are equalized by use of the stopper film 17. To put it specifically, the dielectric layer 14 is etched under a condition that an etching rate for the stopper film 17 is low. Once the etching reaches the stopper film 17, the etching is once stopped. Thereafter, as shown in FIG. 13, the etching is resumed and continued under different etching conditions that the etching rate for the stopper film 17 is high. Thereby, the stopper film 17 is etched.

By once equalizing the depths of the respective interconnection grooves 15B by use of the stopper film 17 as described above, variation in the step (depth) between the interconnection bottoms and the corresponding contact plugs 13 is reduced. Furthermore, the stopper film 17 is etched under the condition that the etching rates for the dielectric layer 12 and the contact plugs 13 are lower than the etching rate for the stopper film 17. Thereby, it is possible to reduce the variation in the step (depth) between the interconnection bottoms and the corresponding contact plugs 13. The quality with which the interconnection materials are embedded in the respective interconnection grooves 15B improves. Moreover, it is possible reduce variation in area of the contacts between the contact plugs 13 and the corresponding interconnection layers 15 to be formed subsequently.

Figure 14:
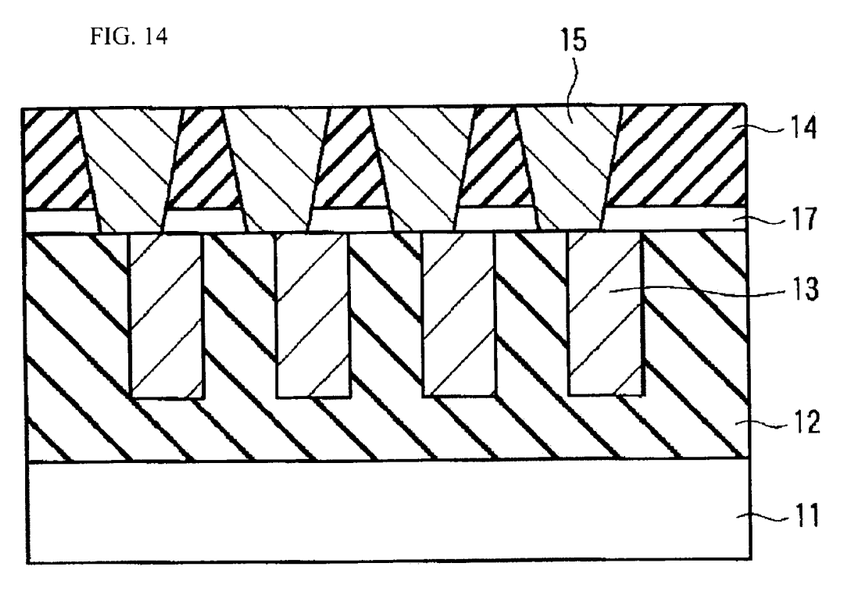
FIG. 14 is a cross-sectional view illustrating a subsequent step in the method of manufacturing the semiconductor device according to the first modification of the first embodiment.

As shown in FIG. 14, conductor films each made of a conductor (for instance, copper (Cu), aluminum (Al), tungsten (W), titanium (Ti), titanium nitride (TiN), tantalum (Ta), tantalum nitride (TaN) and ruthenium (Ru)) are embedded in the respective interconnection grooves 15B. Thereafter, the top of the resultant dielectric layer 14 is flattened by CMP. Thereby, the interconnection layers (damascene interconnections) 15 are formed in the respective interconnection grooves 15B in the dielectric 14 layer.

Figure 15:
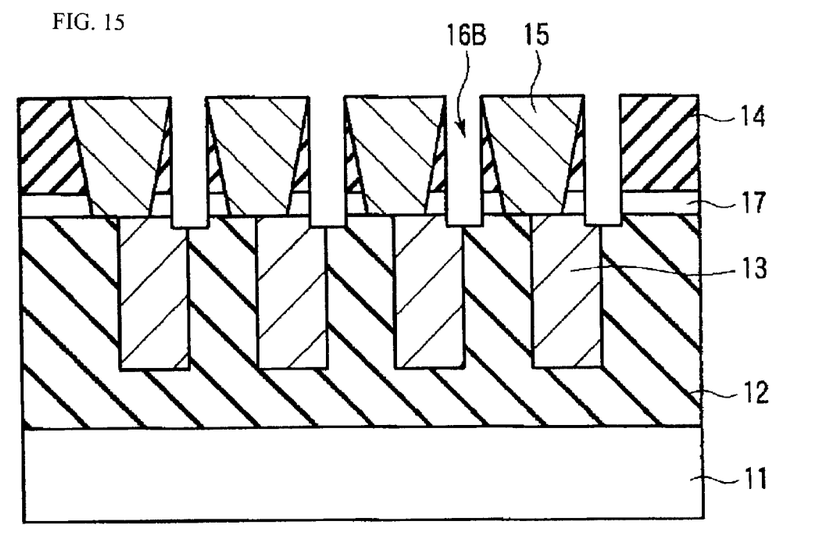
FIG. 15 is a cross-sectional view illustrating a subsequent step in the method of manufacturing the semiconductor device according to the first modification of the first embodiment.

As shown in FIG. 15, by using the embedded interconnection layers 15 as a mask, the dielectric layer 14 between each two interconnection layers 15, parts of the stopper film 17, parts of the dielectric layer 12 and parts of the contact plugs 13 are etched by RIE. Thereby, grooves 16B are formed. In this etching process, first, the dielectric layer 14 is etched. Subsequently, the stopper film 17 is etched. Thereafter, the part of the dielectric layer 12 and the part of the contact plug 13 are etched to a predetermined depth from their respective top surfaces. Different conditions are used for the three etching processes.

Here, the stopper film 17 is etched under a condition that an etching rate for the dielectric layer 12 and the contact plugs 13 is lower than an etching rate for the stopper film 17. Thereafter, the etching is continued to etch the interconnection bottoms and the contact plugs 13. As a result, it is possible to improve the control of the etched depths of the dielectric layer 12 and the contact plugs 13 from their respective surfaces. Otherwise, after the stopper film 17 is etched, the dielectric layer 12 and the contact plugs 13 are etched under a different condition that the etching rates for the dielectric layer 12 and the contact plugs 13 are higher than before.

Thereby, the stopper film 17, for instance, a silicon nitride film is divided into sections between each two neighboring interconnection layers 15, as well as between any one of the interconnection layers 15 and its neighboring contact plug 13. The division can reduce the leakage current which has been a problem with the conventional type of semiconductor device, and to enhance the breakdown voltage.

As shown in FIG. 9, the insulating films 16, for instance, silicon oxide films are embedded in the respective grooves 16B. Thereafter, the top of the resultant dielectric layer 14 is flattened by CMP. Thereby, the insulating films 16 are formed in the respective grooves 16B. Through the foregoing steps, the semiconductor device according to the first modification of the first embodiment is manufactured.

In the case of the first modification, the stopper film 17 which enables an etching ratio of the stopper film 17 formed on the dielectric layer 12 and the contact plugs 13 is different from that of dielectric layer 14. This scheme makes it possible to once stop the etching for forming the interconnection grooves at the stopper film 17, and subsequently to etch the stopper film 17. It is possible to reduce the variation in the depth of the interconnection grooves 16B. As a result, it is possible to embed the metal layers in the interconnection grooves with an embedment quality which is stable within the surface. Moreover, it is possible to reduce the variation in the area of the contacts between the interconnection layers 15 and the corresponding contact plugs 13, and accordingly to decrease the variation in their contact resistances.

Furthermore, if a conductor film is used as the stopper film 17 formed on the dielectric layer 12 and the contact plugs 13, it is possible to reduce the contact resistances between the contact plugs 13 and the corresponding interconnection layers 15, as well as the contact resistances between the contact plugs 13 and the stopper film 17.

Figure 16:
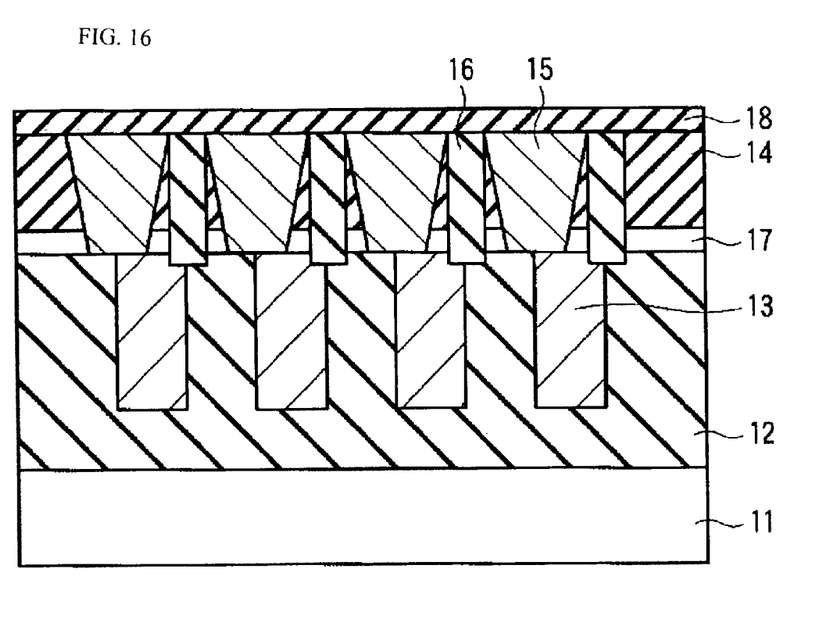
FIG. 16 is a cross-sectional view showing a structure of a semiconductor device according to a second modification of the first embodiment.

FIG. 16 is a cross-sectional view showing a structure of a semiconductor device according to a second modification of the first embodiment. In the case of the second modification, as shown in FIG. 16, a barrier film (top insulating film) 18 (for instance, a silicon nitride film) is formed on the interconnection layers 15, the insulating films 16 and the dielectric layer 14 which are shown in FIG. 9. In addition, the interconnection layers 15 are made of copper (Cu).

Because the second modification causes the barrier film 18 to be formed on the interconnection layers 15 each made of copper, the second modification can prevent the copper from being oxidized or diffused. The rest of the configuration and the effect of the second modification of the first embodiment are the same as those of the first modification of the first embodiment.

Second Embodiment

Next, descriptions will be provided for a semiconductor device according to a second embodiment of the present invention. Component parts which are the same as those of the semiconductor device according to the first embodiment are denoted by the same reference numerals, and descriptions for such component parts will be omitted.

Figure 17:
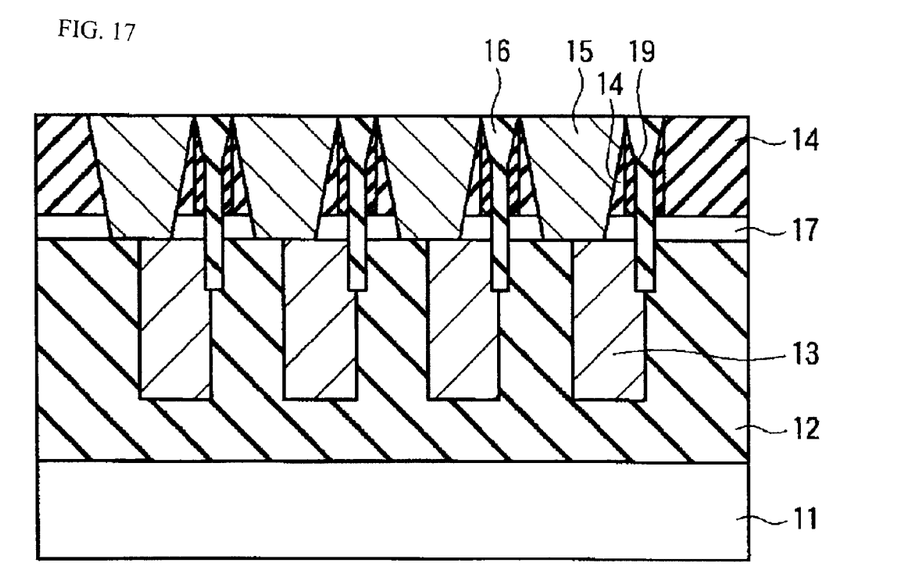
FIG. 17 is a cross-sectional view showing a structure of a semiconductor device according to a second embodiment.

FIG. 17 is a cross-sectional view showing a configuration of the semiconductor device according to the second embodiment of the present invention.

As shown in FIG. 17, a stopper film (bottom film) 17 made of a conductor film is formed on the dielectric layer 12 and each side surface of each of the interconnection layers 15 which are formed on and the contact plugs 13. In addition, a sidewall insulating film 19, for instance, a silicon nitride film is formed on the stopper film 17, and on each side surface of each interconnection layer 15 with a dielectric layer 14 interposed between the sidewall insulating film 19 and the interconnection layer 15. A side surface of this sidewall insulating film 19, which surface is opposite to the side surface contacting the dielectric layer 14, is in contact with the insulating film 16. In addition, the width of the top surface of the stopper film 17 is equal to the sum of the widths of the undersurface of the dielectric layer 14 and the undersurface of the sidewall insulating film 19. The rest of the configuration of the semiconductor device according to the second embodiment is the same as that in the first modification of the first embodiment.

Because the second embodiment causes the sidewall insulating film 19 to be formed on each side surface of each interconnection layer 15, the second embodiment can make each insulating film 16 narrower by the width of the sidewall insulating film 19 than in the first modification of the first embodiment shown in FIG. 9. As a result of that, the second embodiment can reduce the contact resistances between the contact plugs 13 and the corresponding interconnection layers 15, as well as the contact resistance between the contact plugs 13 and the stopper film 17.

Next, descriptions will be provided for a method of manufacturing the semiconductor device according to the second embodiment.

Figure 18:
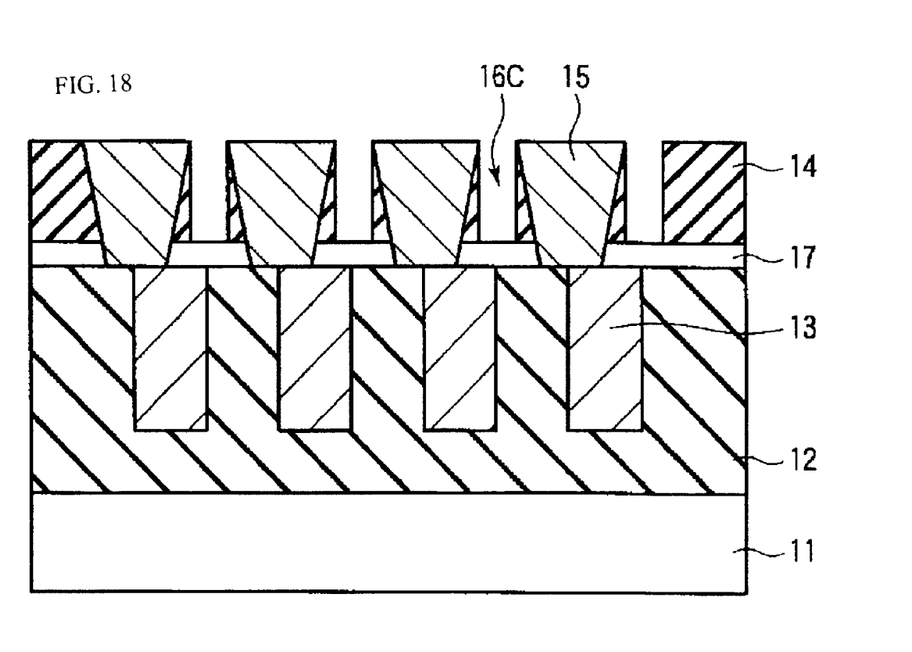
FIG. 18 is a cross-sectional view illustrating a step in a method of manufacturing the semiconductor device according to the second embodiment.

FIGS. 2 to 4, FIGS. 10 to 14, and FIGS. 18 to 20 are cross-sectional views of the respective steps which show the method of manufacturing the semiconductor device according to the second embodiment. The steps shown in FIGS. 2 to 4 and FIGS. 10 to 14 are the same as those included in the method of manufacturing the semiconductor device according to the first modification of the first embodiment. For this reason, the descriptions for the steps shown in FIGS. 2 to 4 and FIGS. 10 to 14 will be omitted. As shown in FIG. 18, by using the embedded interconnection layers 15 shown in FIG. 14 as a mask, the dielectric layer 14 is etched between each two neighboring interconnection layers 15 by RIE. Thereby, grooves 16C are formed. In this etching, once the etching reaches the stopper film 17 after the dielectric layer 14 is etched, the etching is stopped.

Figure 19:
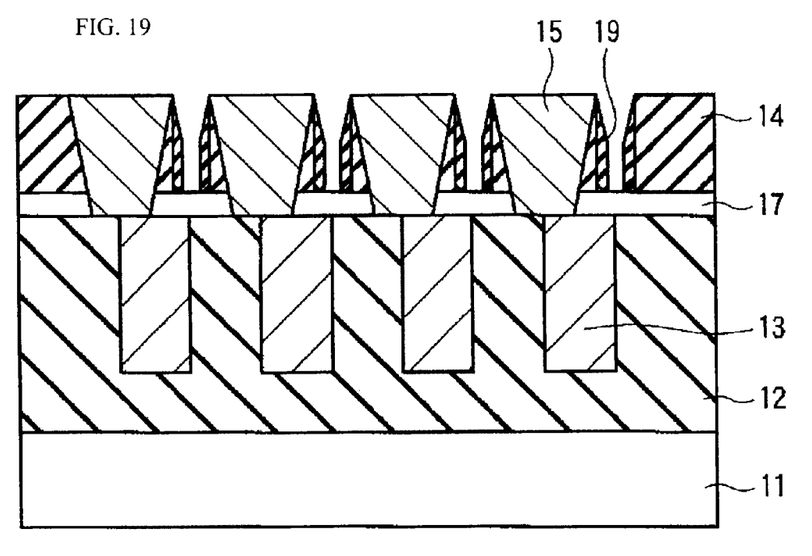
FIG. 19 is a cross-sectional view illustrating a subsequent step in the method of manufacturing the semiconductor device according to the second embodiment.

An insulating film is deposited on the structure shown in FIG. 18. As shown in FIG. 19, the deposited insulating film is etched by an anisotropic etching (for instance, RIE), and the sidewall insulating film 19 is left on each side surface of each interconnecting layer 15. Note that a material, for instance a silicon oxide film or a silicon nitride film, has an etching rate different from that of stopper film 17.

Figure 20:
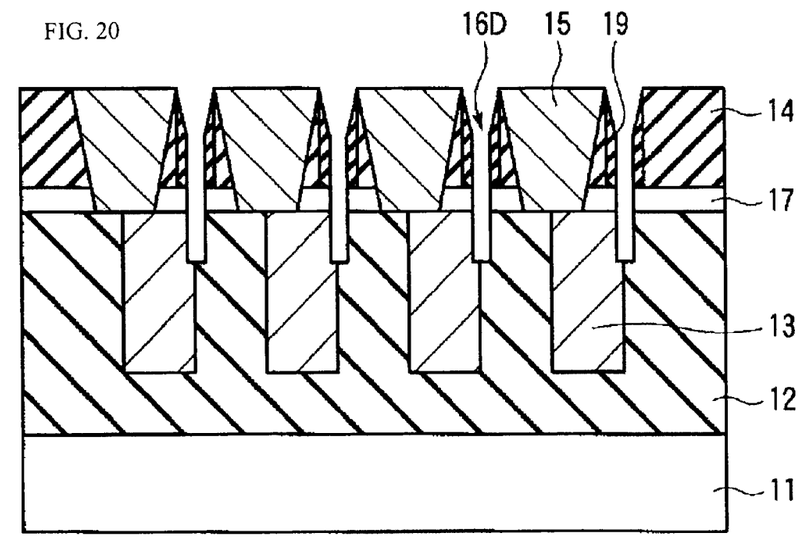
FIG. 20 is a cross-sectional view illustrating a subsequent step in the method of manufacturing the semiconductor device according to the second embodiment.

As shown in FIG. 20, the stopper film 17 between each two neighboring sidewall insulating films 19, parts of the dielectric layer 12 and parts of the contact plugs 13 are etched by RIE using the interconnection layers 15 and the sidewall insulating films 19 as a mask. Thereby, grooves 16D are formed.

Here, the stopper film 17 is etched under a condition that an etching rate for the dielectric layer 12 and the contact plugs 13 is lower than an etching rate for the stopper film 17. Thereafter, the etching is continued to etch the dielectric layer 12 and the contact plugs 13. As a result, it is possible to enhance the control of the etched depths of the dielectric layer 12 and the contact plugs 13 from their respective surfaces. Otherwise, after the stopper film 17 is etched, the dielectric layer 12 and the contact plugs 13 are etched under a condition that the etching rates for are higher.

Subsequently, as shown in FIG. 17, the insulating films 16, for instance, silicon oxide films are embedded in the respective grooves 16D. Thereafter, the top of the resultant dielectric layer 14 is flattened by CMP. Thereby, the insulating films 16 are formed in the respective grooves 16B. Through the foregoing steps, the semiconductor device according to the second embodiment is manufactured.

Next, descriptions will be provided for a semiconductor device according to a modification of the second embodiment.

Figure 21:
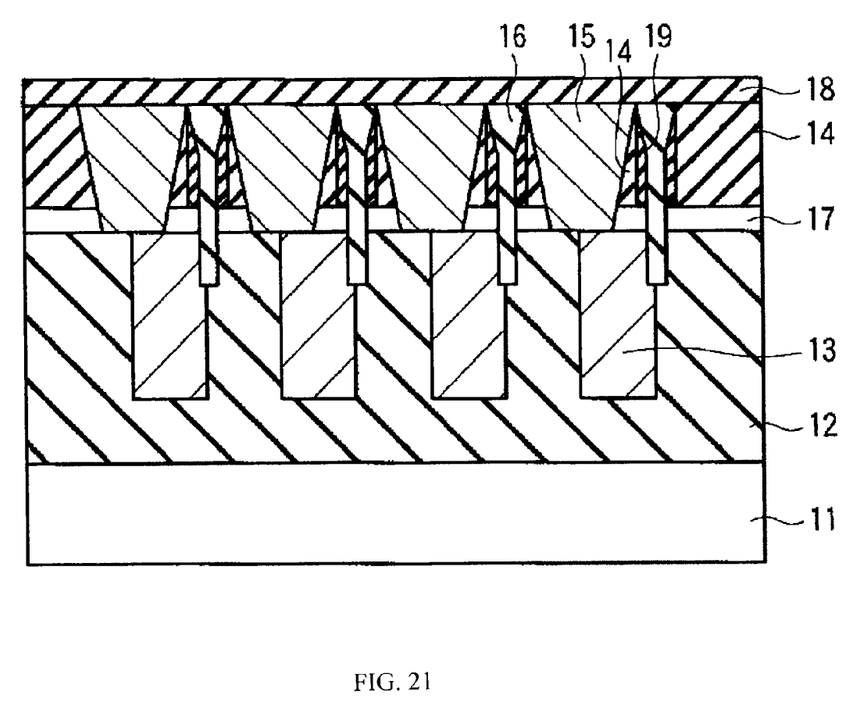
FIG. 21 is a cross-sectional view showing a structure of a semiconductor device according to a modification of the second embodiment.

FIG. 21 is a cross-sectional view showing a configuration of the semiconductor device according to the modification of the second embodiment.

In the case of this modification, as shown in FIG. 21, the barrier film (top insulating film) 18 (for instance, a silicon nitride film) is formed on the interconnection layers 15, the insulating films 16 and the dielectric layer 14 which are shown in FIG. 17. In addition, the interconnection layers 15 are made of copper (Cu). Because this modification causes the barrier film 18 to be formed on the interconnection layers 15 each made of copper, this modification can prevent the copper from being oxidized or diffused. The rest of the configuration and the effect of this modification are the same as those of the second embodiment.

The foregoing embodiments may be carried out not only solely but also in combination whenever deemed necessary. In addition, the foregoing embodiments include the various aspects of the invention. For this reason, when the configuration elements disclosed in the foregoing embodiments are combined depending on the necessity, additional various aspects of the invention can be extracted.

What is claimed is:

1. A semiconductor device comprising:
a first dielectric layer formed on top of a semiconductor substrate;
a contact plug embedded in the first dielectric;
a second dielectric layer formed on top of the first dielectric layer;
an interconnection layer embedded in a groove formed in the second dielectric layer on top of the contact plug; and
an insulating film formed in the second dielectric layer adjacent to a side surface of the interconnection layer,
wherein a notch is located in a part of a top surface of the contact plug, and
the insulating film is formed to extend from a top surface of the second dielectric layer into the notch included in the contact plug.

2. The semiconductor device according to claim 1, wherein the interconnection contains copper.

3. The semiconductor device according to claim 1, wherein
a first portion of the top surface of the contact plug does not contact with a top surface of the interconnection layer, and
the notch is located in a part of the first portion.

4. The semiconductor device according to claim 1, further comprising a bottom film formed on a side surface of the interconnection layer and formed on top of the contact plug.

5. The semiconductor device according to claim 4, further comprising a sidewall insulating film formed on top of the bottom film, the sidewall insulating film formed on the side surface of the interconnection layer.

6. The semiconductor device according to claim 5, wherein the bottom film is a conductor.

7. The semiconductor device according to claim 1, further comprising a top insulating film formed on top of both the interconnection layer and the insulating film.

8. The semiconductor device according to claim 1, wherein the interconnection layer is tapered downward.

9. The semiconductor device according to claim 1, wherein an end portion of a top surface of the insulating film is in contact with the interconnection layer.

10. The semiconductor device according to claim 1, wherein the first and second dielectric layers each comprises an interlayer dielectric layer.

11. A semiconductor device comprising:
a first dielectric layer formed on top of a semiconductor substrate;
a plurality of contact plugs embedded in the first dielectric layer;
a second dielectric layer formed on top of the first dielectric layer;
a plurality of interconnection layers respectively embedded in grooves formed in the second dielectric layer on top of the respective the plurality of contact plugs; and
a plurality of insulating films each formed in the second dielectric layer between adjacent ones of the plurality of interconnection layers,
wherein a notch is located in a part of a top surface of the each of the contact plugs, and
the plurality of insulating films are formed to extend from a top surface of the second dielectric layer into each of the notches included in the plurality of the contact plugs, respectively.

12. The semiconductor device according to claim 11, wherein the plurality of interconnection layers contain copper.

13. The semiconductor device according to claim 11, wherein
a first portion of the top surface of each of the plurality of the contact plugs has a first portion that does not contact with an undersurface of the plurality of the interconnection layers, and
each of the notches is located in a respective part of the first portions.

14. The semiconductor device according to claim 11, further comprising bottom films formed on side surfaces of the plurality of interconnection layers and formed on top of the plurality of contact plugs, respectively.

15. The semiconductor device according to claim 14, further comprising sidewall insulating films formed on top of the bottom films, the sidewall insulating films formed on the side surfaces of the plurality of interconnection layers, respectively.

16. The semiconductor device according to claim 15, wherein the bottom films are conductors.

17. The semiconductor device according to claim 11, further comprising a top insulating film formed on top of both the plurality of interconnection layers and the plurality of insulating films.

18. The semiconductor device according to claim 11, wherein the plurality of interconnection layers are tapered downward.

19. The semiconductor device according to claim 11, wherein end portions of top surfaces of the plurality of insulating films are in contact with the plurality of interconnection layers.

20. The semiconductor device according to claim 11, wherein each of the first and second dielectric layers comprises an interlayer dielectric layer.

21. A method of manufacturing a semiconductor device, comprising:
   forming a plurality of contact plugs in a first interlayer dielectric formed on a semiconductor substrate;
   forming a second interlayer dielectric on top of the first interlayer dielectric and the plurality of contact plugs;
   forming a plurality of first grooves in the second interlayer dielectric;
   forming a plurality of interconnection layers by embedding conductor films in the plurality of first grooves, respectively;
   forming second grooves by etching part of the second interlayer dielectric, the first interlayer dielectric, and the plurality of contact plugs by using the plurality of interconnection layers as a mask; and
   embedding an insulating film in each of the second grooves.

* * * * *